(12) United States Patent
Zhang

(10) Patent No.: US 8,929,102 B2
(45) Date of Patent: Jan. 6, 2015

(54) SAMPLE AND HOLD BUFFER

(75) Inventor: Guangchao Zhang, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 332 days.

(21) Appl. No.: 13/527,335

(22) Filed: Jun. 19, 2012

(65) Prior Publication Data

US 2013/0336022 A1    Dec. 19, 2013

(51) Int. Cl.
*H02M 3/335* (2006.01)
*H03M 1/00* (2006.01)

(52) U.S. Cl.
USPC ............. 363/21.17; 363/21.16; 341/122

(58) Field of Classification Search
CPC ..................... H02M 3/335; G11C 27/024
USPC ........ 363/20, 21.01, 21.12, 21.16, 21.17, 95, 363/97, 131; 341/122, 125
See application file for complete search history.

(56) References Cited

U.S. PATENT DOCUMENTS

| | | | |
|---|---|---|---|
| 7,859,131 B2* | 12/2010 | Xu et al. | 307/11 |
| 8,077,484 B2* | 12/2011 | Djenguerian et al. | 363/21.01 |
| 2011/0261596 A1* | 10/2011 | Zong et al. | 363/21.13 |
| 2011/0267850 A1* | 11/2011 | Lin et al. | 363/21.17 |

* cited by examiner

Primary Examiner — Matthew Nguyen
(74) Attorney, Agent, or Firm — Morrison & Foerster LLP

(57) ABSTRACT

This relates to sampling a feedback signal representative of an output of a power converter. The sampling is performed using a buffer sampling circuit having three sample and hold stages coupled in series to sense and store the feedback signal. The first stage is coupled to sample and hold the feedback signal on a capacitor. If the output diode is conducting, the sampled signal is transferred to the second stage. If the output diode is conducting, the first stage will sample the feedback signal and the sampled signal will be transferred to be sampled and held by the second stage. When the output diode stops conducting, the sampled voltage held by the second stage is transferred to the third stage. The third stage stores the sampled voltage on a capacitor. As such, the controller may sample the feedback signal near the end of the output diode conduction time.

21 Claims, 6 Drawing Sheets

SAMPLE AND HOLD BUFFER

BACKGROUND

1. Field

The present disclosure relates generally to power converter controllers and, more specifically, to sampling circuits for power converter controllers.

2. Discussion of the Related Art

Many electrical devices, such as cell phones, personal digital assistants (PDA's), laptops, etc., utilize power to operate. Because power is generally delivered through a wall socket as high voltage alternating current (ac), a device, typically referred to as a power converter, can be utilized to transform the high voltage ac input to a well regulated direct current (dc) output through an energy transfer element. Switched mode power converters are commonly used due to their high efficiency, small size, and low weight to power many of today's electronics. In operation, a switch is utilized to provide the desired output quantity by varying the duty cycle (typically the ratio of the on-time of the switch to the total switching period), varying the switching frequency, or varying the number of pulses per unit time of the switch in a power converter.

A power converter may use a controller to provide output regulation to an electrical device (generally referred to as a load) by sensing and controlling the output of the power converter in a closed loop. More specifically, the controller may be coupled to a sensor that provides feedback information about the output of the power converter in order to regulate the output quantity delivered to the load. The controller regulates the output quantity delivered to the load by controlling a switch to turn on and off in response to the feedback information from the sensor to transfer energy pulses to the power converter output from a source of input power, such as a power line.

The sensor used in the power converter to provide the feedback information may include an optocoupler that receives information about the output voltage directly from the output of the power converter. The output of the power converter is also coupled to a secondary winding of the energy transfer element. This type of control scheme is typically referred to as "secondary-side control." Another type of control scheme, commonly referred to as "primary-side control," may alternatively be utilized by the controller. In primary-side control, the sensor may include a primary-referenced winding (e.g., a bias winding) of the energy transfer element to provide a signal representative of the output voltage of the power converter immediately after a switching event that delivers energy to the output. Although primary-side control eliminates the cost and the power consumed by an optocoupler, the output voltage cannot be sensed in the absence of switching. In addition, the amount of time during which the output voltage may be sensed varies due to load conditions.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
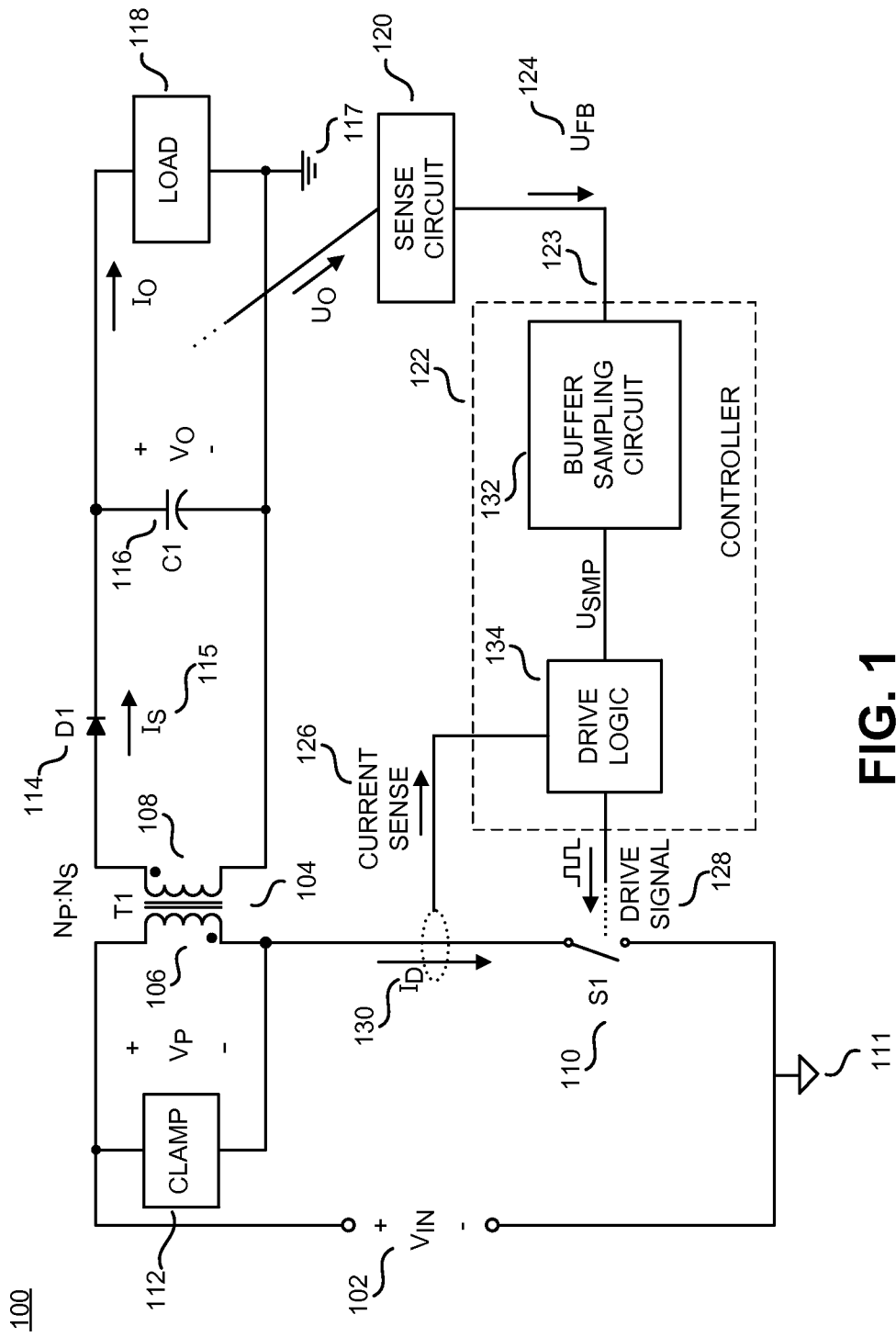
FIG. 1 is a functional block diagram illustrating an example power converter including a controller, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example," or "an example" means that a particular feature, structure or characteristic described in connection with the embodiment or example is included in at least one embodiment of the present invention. Thus, appearances of the phrases "in one embodiment", "in an embodiment", "one example," or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, example integrated controllers for power converters provide output regulation by sensing and controlling the output of the power converter in a closed loop. A sense circuit included in the power converter may rely on a magnetic coupling between isolated windings (e.g. a bias winding) of an energy transfer element to provide a signal representative of the output voltage. As mentioned previously, this type of control is often referred to as "primary-side control" or control using primary-side feedback.

Although primary-side feedback eliminates the cost and the power consumed by an optocoupler, the output voltage cannot be sensed in the absence of switching. Thus, example controllers in accordance with the teachings herein include a circuit for sampling the signal provided by the sense circuit. As will be further discussed, the sampled signal is stored on a capacitor and received by the drive logic of the controller to control the power switch. However, there is a limited amount of time that the signal provided by the sense circuit (herein referred to as the feedback signal) is representative of the output voltage. In addition, the amount of time which the output voltage may be sensed varies due to load conditions.

In primary-side control, the amount of time which the feedback signal is representative of the output voltage is related to the length of the output diode conduction time. At the beginning of the output diode conduction time there is ringing in the bias winding voltage. The voltage on the bias winding eventually settles close to a voltage representative of the output voltage until the end of the output diode conduction time, at which time the bias winding voltage falls to zero. As such, the controller should sample the signal provided by the sense circuit as close to the end of the output diode conduction time.

Embodiments disclosed herein utilize a buffer sampling circuit to sense and store the signal provided by the sense circuit. The buffer sampling circuit further includes three sample and hold stages coupled in series to sense and store the output voltage of the power converter. The first sample and hold stage is coupled to sample and hold the sensed output voltage on a capacitor. If the output diode is still conducting, the sensed output voltage is then transferred to the second sample and hold stage. As long as the output diode is conducting, the first sample and hold stage will sample the sensed output voltage and the sensed output voltage will be transferred to be sampled and held by the second sample and hold stage. When the output diode stops conducting, the sensed output voltage held by the second sample and hold stage is then transferred to the third sample and hold stage. The third sample and hold stage stores the sensed output voltage on a capacitor. As such, the controller may sample the signal provided by the sense circuit close to the end of the output diode conduction time.

Referring first to FIG. 1, a functional block diagram illustrating an example power converter 100 including a controller 122, in accordance with the teachings of the present disclosure, is shown. The illustrated example of power converter 100 includes an energy transfer element T1 104, a primary winding 106 of the energy transfer element T1 104, a secondary winding 108 of the energy transfer element T1 104, a switch S1 110, an input return 111, a clamp circuit 112, a rectifier D1 114 (also referred to as an output diode D1), an output capacitor C1 116, an output return 117, a sense circuit 120, and a controller 122. Controller 122 is shown as including a single feedback terminal 123, a buffer sampling circuit 132, and drive logic 134. Also shown in FIG. 1 are an input voltage $V_{IN}$ 102, an output quantity $U_O$, an output voltage $V_O$, an output current $I_O$, a secondary current $I_S$ 115, a feedback signal $U_{FB}$ 124, a current sense signal 126, a drive signal 128, and switch current $I_D$ 130. In the illustrated example, the power converter 100 is shown as having a flyback topology for explanation purposes. It is appreciated that other known topologies and configurations of power converters may also benefit from the teachings of the present disclosure.

The power converter 100 provides output power to a load 118 from an unregulated input $V_{IN}$ 102. In one embodiment, the input $V_{IN}$ 102 is a rectified and filtered ac line voltage. In another embodiment, the input voltage $V_{IN}$ 102 is a dc input voltage. The input $V_{IN}$ 102 is coupled to the energy transfer element T1 104. In some embodiments, the energy transfer element T1 104 may be a coupled inductor. In other embodiments, the energy transfer element T1 104 may be transformer. In the example of FIG. 1, the energy transfer element T1 104 includes two windings, a primary winding 106 and secondary winding 108. $N_P$ and $N_S$ are the number of turns for the primary winding 106 and secondary winding 108, respectively. In the example of FIG. 1, primary winding 106 may be considered an input winding, and secondary winding 108 may be considered an output winding. The primary winding 106 is further coupled to power switch S1 110, which is then further coupled to the input return 111. In addition, the clamp circuit 112 is coupled across the primary winding 106 of the energy transfer element T1 104.

The secondary winding 108 of the energy transfer element T1 104 is coupled to the rectifier D1 114. In the example illustrated in FIG. 1, the rectifier D1 114 is exemplified as a diode and the secondary winding 108 is coupled to the anode of the diode. However, in some embodiments, the rectifier D1 114 may be a transistor used as a synchronous rectifier. Both the output capacitor C1 116 and the load 118 are coupled to the rectifier D1 114. In the example of FIG. 1, both the output capacitor C1 116 and the load 118 are coupled to the cathode of the diode. An output is provided to the load 118 and may be provided as either an output voltage $V_O$, output current $I_O$, or a combination of the two.

The power converter 100 further comprises circuitry to regulate the output, which is exemplified as output quantity $U_O$. A sense circuit 120 is coupled to sense the output quantity $U_O$ and to provide feedback signal $U_{FB}$ 124, which is representative of the output quantity $U_O$. As will be discussed in more detail below, the sense circuit 120 may sense the output quantity from an additional winding of the energy transfer element T1 104. In another embodiment, the sense circuit 120 may sense the output quantity $U_O$ directly from the output of the power converter 100 through a circuit, such as an opto-coupler. In general, the output quantity $U_O$ is either an output voltage $V_O$, output current $I_O$, or a combination of the two.

Controller 122 is coupled to the sense circuit 120 and may include several terminals. At terminal 123, the controller 122 receives feedback signal $U_{FB}$ 124 from the sense circuit 120. The controller 122 further includes terminals for receiving the current sense signal 126 and for providing the drive signal 128 to switch S1 110. The current sense signal 126 may be representative of the switch current $I_D$ 130 in switch S1 110. In addition, the controller 122 provides drive signal 128 to the switch S1 110 to control various switching parameters. Examples of such parameters may include switching frequency, switching period, duty cycle, or respective on and off times of the switch S1 110.

As illustrated in FIG. 1, the controller 122 includes buffer sampling circuit 132 and drive logic 134. The buffer sampling circuit 132 is coupled to receive the feedback signal $U_{FB}$ 124. The output of the buffer sampling circuit 132 (sampled signal $U_{SMP}$) is then coupled to and received by drive logic 134. Drive logic 134 further receives current sense signal 126 and outputs drive signal 128 in response to the output of the buffer sampling circuit 132 (sampled signal $U_{SMP}$). In some embodiments, the drive logic 134 also outputs drive signal 128 in response to the current sense signal 126.

In the example of FIG. 1, input voltage $V_{IN}$ 102 is positive with respect to input return 111, and output voltage $V_O$ is positive with respect to output return 117. The example of FIG. 1 shows galvanic isolation between the input return 111 and the output return 117. In other words, a dc voltage applied between input return 111 and output return 117 will produce substantially zero current. Therefore, circuits electrically coupled to the primary winding 106 are galvanically isolated from circuits electrically coupled to the secondary winding 108.

In operation, the power converter 100 of FIG. 1 provides output power to the load 118 from an unregulated input $V_{IN}$ 102. The power converter 100 utilizes the energy transfer element T1 104 to transfer energy between the primary 106 and secondary 108 windings. The clamp circuit 112 is coupled to the primary winding 106 of the energy transfer element T1 104 to limit the maximum voltage on the switch S1 110. Switch S1 110 is opened and closed in response to the drive signal 128 received from the controller 122. It is generally understood that a switch that is closed may conduct current and is considered on, while a switch that is open cannot conduct current and is considered off. In the example of FIG. 1, switch S1 110 controls a current $I_D$ 130 in response to controller 122 to meet a specified performance of the power converter 100. In some embodiments, the switch S1 110 may be a transistor and the controller 122 may include integrated circuits and/or discrete electrical components. In one embodiment controller 122 and switch S1 110 are included together into a single integrated circuit. In one example, the integrated circuit is a monolithic integrated circuit. In another example, the integrated circuit is a hybrid integrated circuit.

The operation of switch S1 110 also produces a time varying voltage $V_P$ across the primary winding 106. By transformer action, a scaled replica of the voltage $V_P$ is produced across the secondary winding 108, the scale factor being the ratio that is the number of turns $N_S$ of secondary winding 108 divided by the number of turns $N_P$ of primary winding 106. The switching of switch S1 110 also produces a pulsating current (i.e. secondary current $I_S$ 115) at the rectifier D1 114. The secondary current $I_S$ 115 in rectifier D1 114 is filtered by output capacitor C1 116 to produce a substantially constant output voltage $V_O$, output current $I_O$, or a combination of the two at the load 118.

The sense circuit 120 senses the output quantity $U_O$ to provide the feedback signal $U_{FB}$ 124 to the controller 122. In the example of FIG. 1, the controller 122 also receives the current sense input 126 which relays the sensed switch current $I_D$ 130 in the switch S1 110. The switch current $I_D$ 130 may be sensed in a variety of ways, such as, for example, the voltage across a discrete resistor or the voltage across the transistor when the transistor is conducting.

The controller 122 outputs drive signal 128 to operate the switch S1 110 in response to various system inputs to substantially regulate the output quantity $U_O$ to the desired value. With the use of the sense circuit 120 and the controller 122, the output of the switched mode power converter 100 is regulated in a closed loop. Controller 122 further includes buffer sampling circuit 132 to receive and sample the feedback signal $U_{FB}$ 124 that is representative of the output quantity $U_O$. The sample stored by buffer sampling circuit 132 is then outputted to drive logic 134 as sampled signal $U_{SMP}$. The buffer sampling circuit 132 provides a way to store the feedback signal $U_{FB}$ 124 representative of output quantity $U_O$ close to the end of the output diode conduction time (the conduction time of rectifier D1 114).

Figure 2:
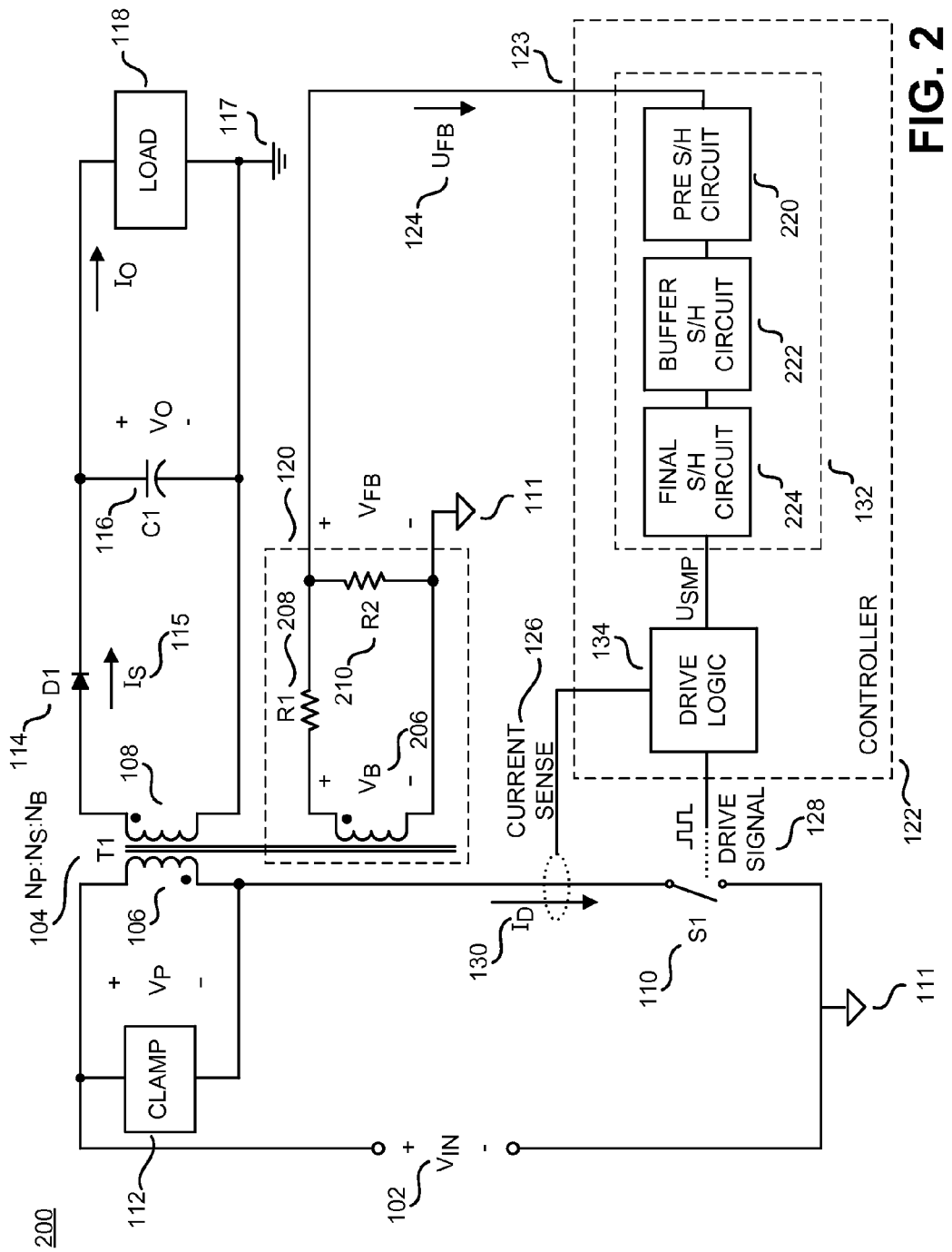
FIG. 2 is a functional block diagram illustrating an example power converter having a sense circuit that includes a primary-referenced winding, in accordance with the teachings of the present disclosure.

FIG. 2 is a functional block diagram illustrating an example power converter 200 having a sense circuit 120 that includes a primary-referenced winding (e.g., bias winding 206), in accordance with the teachings of the present disclosure. Power converter 200 is one possible implementation of power converter 100 and provides further details as to a possible sense circuit 120 and buffer sampling circuit 132. In FIG. 2, example sense circuit 120 is illustrated as including bias winding 206 and resistors R1 208 and R2 210. Bias winding 206 may be an additional winding of energy transfer element T1 104 with $N_B$ as the number of turns of the bias winding 206. The illustrated example of and buffer sampling circuit 132 is shown in FIG. 2 as including a pre-sample and hold circuit 220, a buffer sample and hold circuit 222, and a final sample and hold circuit 224.

In the illustrated embodiment, sense circuit 120 provides the feedback signal $U_{FB}$ 124. Resistors R1 208 and R2 210 are coupled across the bias winding 206. Bias winding 206 and resistor R2 210 are coupled to input return 111. In the example shown, the voltage across resistor R2 210 (feedback voltage $V_{FB}$) is utilized as the feedback signal $U_{FB}$ 124. The feedback voltage $V_{FB}$ is received by the controller 122 at terminal 123 and further, the buffer sampling circuit 132.

In operation, the bias winding 206 produces a voltage $V_B$ that is responsive to the output voltage $V_O$ when the output diode D1 114 coupled to secondary winding 108 conducts. Feedback voltage $V_{FB}$ and feedback signal $U_{FB}$ 124 are representative of the output voltage $V_O$ during at least a portion of an OFF time of switch S1 110. During the on-time of the switch S1 110, the bias winding 206 produces a voltage $V_B$ in is response to the input voltage $V_{IN}$ 102. In another example, bias winding 210 may also provide a source of power to the circuits within controller 122. Resistors R1 208 and R2 210 are utilized to scale down the voltage of the bias winding 206. As such, feedback voltage VFB is a scaled version of the bias voltage $V_B$.

It is appreciated that many variations are possible in the use of a bias winding to sense an output voltage $V_O$ and for providing sensing while also providing power to a controller with galvanic isolation. For example, a bias winding may apply a rectifier and a capacitor similar to rectifier D1 114 and capacitor C1 116, respectively, to produce a dc bias voltage while providing an ac feedback signal from the anode of the rectifier. As such, additional passive components such as resistors may be used on the bias winding to scale the voltage from the winding to a value that is more suitable to be received by controller 122.

Use of bias winding 206 to sense output voltage $V_O$ provides galvanic isolation between the output voltage $V_O$ and the controller 122 without the expense of an optocoupler. However, when using a winding of energy transfer element 104 to sense output voltage $V_O$, the voltage $V_B$ at bias winding 206 is representative of output voltage $V_O$ only when output rectifier D1 114 is conducting. In other words, the sense circuit 120 may only sense the output voltage $V_O$ during the off-time of the switch S1 110. However, the length of the output diode D1 114 conduction time is variable. As will be further shown, the voltage $V_B$ (and as such the feedback voltage $V_{FB}$) is representative of the output voltage $V_O$ and then falls to zero during the off time of a switching cycle. The lighter the load, the quicker the output voltage $V_O$ falls to zero during the off-time. As such, the amount of time to sense the output voltage $V_O$ of the power converter 200 is variable with the load.

Embodiments of the present disclosure may utilize buffer sampling circuit 132 to sample the feedback signal $U_{FB}$ 124 (i.e., feedback voltage $V_{FB}$) close to the end of the output diode D1 114 conduction time. The buffer sampling circuit 132 may include three sample and hold stages coupled in series to sense and store the feedback signal $U_{FB}$ 124 of the power converter. The feedback signal $U_{FB}$ 124 is received and held by the pre-sample and hold circuit 220 when the output diode D1 114 is conducting. If the output diode D1 114 is still conducting, the value stored by the pre-sample and hold circuit 220 is then sampled by the buffer sample and hold circuit 222. In other words, the value stored by the pre-sample and hold circuit 220 is transferred to the buffer sample and hold circuit 222 if the output diode D1 114 is conducting. The pre-sample and hold circuit 220 continues to sample the feedback signal $U_{FB}$ 124 and transfers the sampled value of the feedback signal $U_{FB}$ 124 to the buffer sample and hold circuit 222 until the output diode D1 114 stops conducting. When the output diode D1 114 stops conducting, the value held by the buffer sample and hold circuit 222 is sampled and held by the final sample and hold circuit 224. The value held by the final sample and hold circuit 224 is then received by drive logic 134 as sampled signal $U_{SMP}$.

Figure 3:
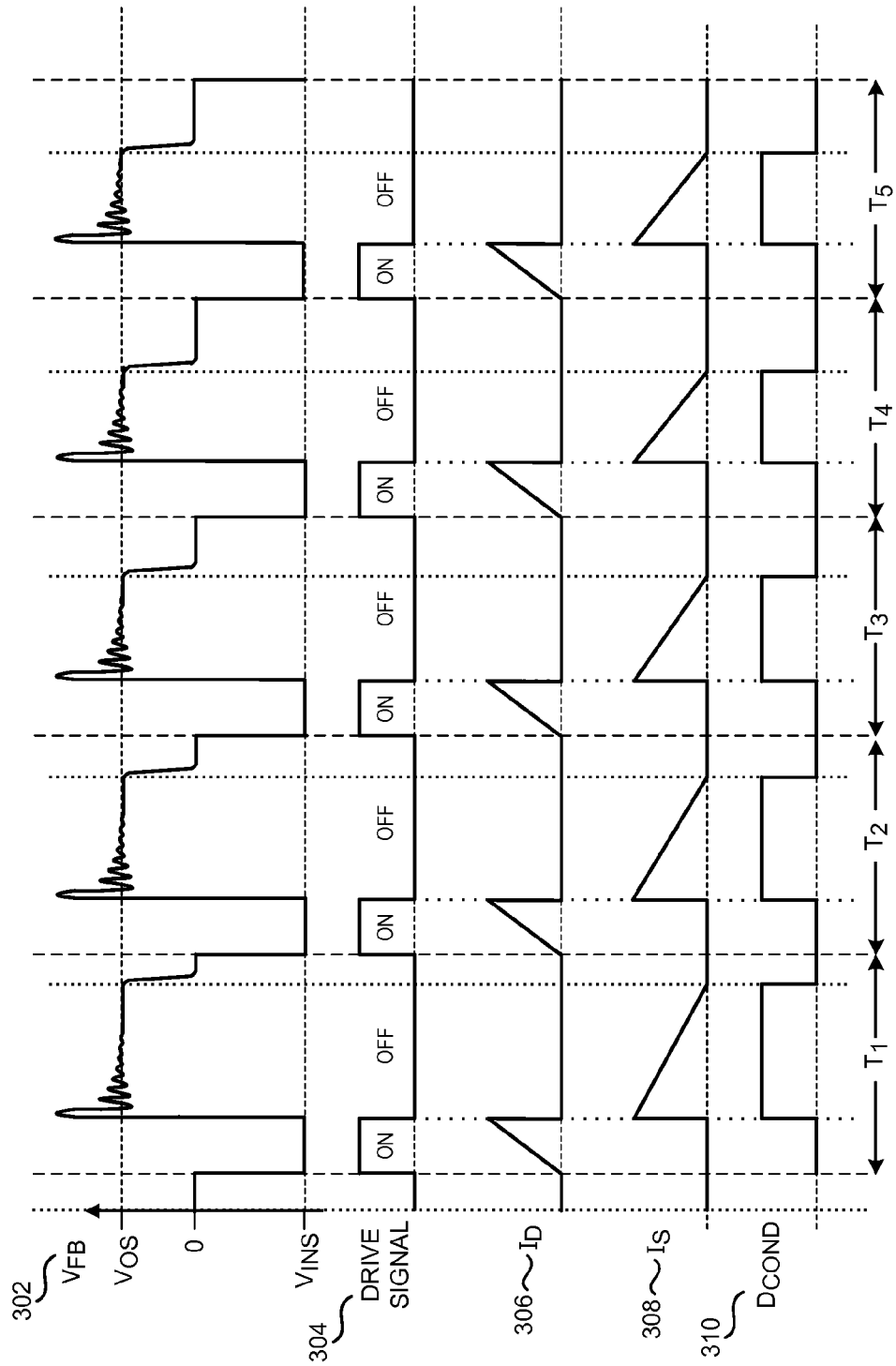
FIG. 3 illustrates example voltage and current waveforms and a drive signal of an example power converter, in accordance with the teachings of the present disclosure.

FIG. 3 illustrates example waveforms for an example power converter including a feedback voltage $V_{FB}$ 302, a drive signal 304, a switch current $I_D$ 306, a secondary current $I_S$ 308, and a diode conduction signal $D_{COND}$ 310. Feedback voltage $V_{FB}$ 302 is one example of the feedback signal $U_{FB}$ 124. In the example shown, a logic high value of drive signal 304 corresponds to the switch S1 110 as being ON (i.e., closed). When the switch S1 110 is ON, feedback voltage $V_{FB}$ 302 goes negative to a magnitude $V_{INS}$ that is representative of the input voltage $V_{IN}$ 102. During this time, the switch current $I_D$ 306 increases until the switch S1 110 turns off (illustrated by drive signal 304 transitioning from a logic high to logic low value), at which time the switch current $I_D$ 306 falls to zero. While FIG. 3 illustrates a power converter operating in discontinuous conduction mode (DCM), it should be appreciated that embodiments of the present disclosure may also be utilized with power converters operating in continuous conduction mode (CCM). When the switch S1 110 is OFF (i.e., open), the output rectifier D1 114 conducts to allow sensing of the output voltage $V_O$ as the feedback voltage $V_{FB}$ 302 converges to a positive voltage $V_{OS}$ that is representative of the output voltage $V_O$. As shown in FIG. 3, there is ringing at the feedback voltage $V_{FB}$ 302. A pulsating current is produced at the rectifier D1 114 when the switch S1 110 turns off, illustrated by secondary current $I_S$ 308. During the off-time, secondary current $I_S$ 308 falls to zero indicating the output diode D1 114 has stopped conducting. As such, the feedback voltage $V_{FB}$ 302 also falls to zero until the start of the next switching cycle. Further illustrated is diode conduction signal $D_{COND}$ 310, which is a rectangular pulse waveform with varying lengths of logic high and logic low sections. In the example shown, diode conduction signal $D_{COND}$ 310 is logic high when the rectifier D1 114 is conducting (in other words, when the secondary current $I_S$ 308 is non-zero). In one example, the diode conduction time may be generated by comparing the feedback voltage $V_{FB}$ 302 with a reference voltage. If the feedback voltage $V_{FB}$ 302 is greater than the reference voltage, the diode conduction signal is high. The diode conduction time may also be generated by sensing the bias voltage $V_B$ of the bias winding 206. A rising edge in the bias voltage $V_B$ indicates the beginning of the diode conduction time while a falling edge of the bias voltage $V_B$ indicates the end of the diode conduction time. The bias voltage $V_B$ may be compared to a reference voltage to determine when the rising and falling edges occur.

Multiple switching cycles (T1-T5) are shown in FIG. 3 to illustrate the relationship between the output diode conduction time and the feedback voltage $V_{FB}$ 302. As mentioned above, the diode conduction time may vary due to various factors, such as the load conditions. In general, lighter loads correspond to shorter output diode conduction times. As shown in switching cycles T1 through T5, as the diode conduction time shortens (i.e., the secondary current $I_S$ 308 falls to zero sooner), the feedback voltage $V_{FB}$ 302 also falls to zero sooner.

As shown in FIG. 3, the value of feedback voltage $V_{FB}$ 302 is closest to $V_{OS}$ (and thus most closely represents output voltage $V_O$) near the end of the conduction time of rectifier D1 114 (just before the secondary current $I_S$ 308 reaches zero). Thus, to obtain accurate approximations of output voltage $V_O$, it can be desirable to measure feedback voltage $V_{FB}$ 302 close to the end of the output diode conduction time. However, as mentioned above, this can be difficult due to the variation in length of the diode conduction time. The controller 122 and buffer sampling circuit 132 shown in FIGS. 1 and 2 can be used to sample feedback voltage $V_{FB}$ 302 close to the end of the output diode conduction time despite the variation in the length of the diode conduction time. One example implementation of buffer sampling circuit 132 will be described in greater detail below with respect to FIGS. 4 and 5.

Figure 4:
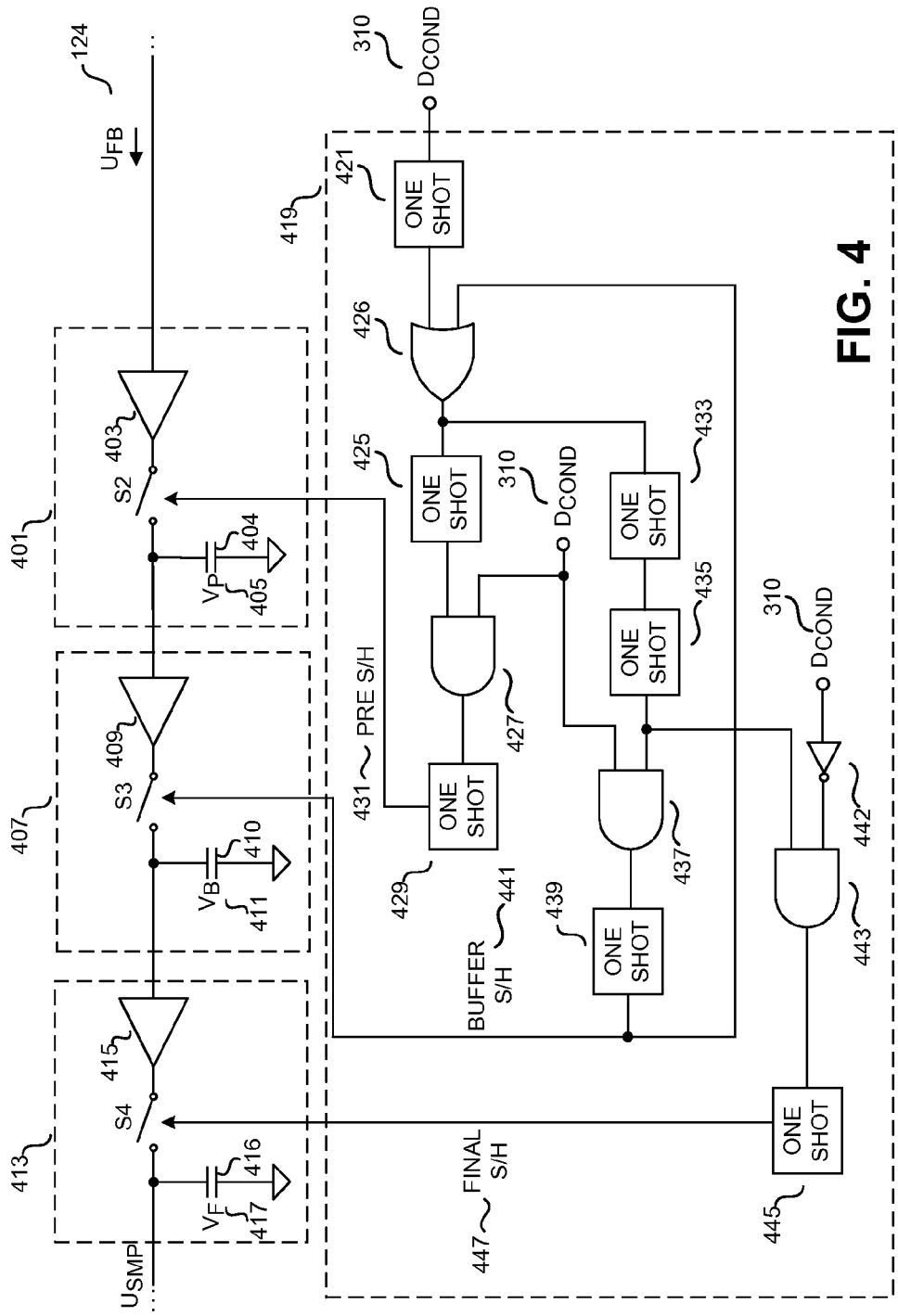
FIG. 4 is a functional block diagram illustrating an example buffer sampling circuit, in accordance with the teachings of the present disclosure.

FIG. 4 is a functional block diagram illustrating an example buffer sampling circuit 132, in accordance with the teachings of the present disclosure. Buffer sampling circuit 132 shown in FIG. 4 is one possible implementation of buffer sampling circuit 132 shown in FIGS. 1 and 2. In FIG. 4, example buffer sampling circuit 132 generally includes pre-sample and hold circuit 401, buffer sample and hold circuit 407, final sample and hold circuit 413, and sample control circuit 419. Pre-sample and hold circuit 401, buffer sample and hold circuit 407, and final sample and hold circuit 413 are examples of pre-sample and hold circuit 220, buffer sample and hold circuit 222, and final sample and hold circuit 224, respectively.

In the example shown in FIG. 4, pre-sample and hold circuit 220 includes buffer 403, switch S2, and capacitor 404. One end of buffer 403 is coupled to receive feedback signal $U_{FB}$ 124 and the other end is coupled to switch S2. Switch S2 is controlled by pre-sample and hold control signal 431 received from sample control circuit 419. In operation, when switch S2 is turned on (closed), capacitor 404 is charged by buffer 403 and feedback signal $U_{FB}$ 124. When switch S2 is turned off (opened), capacitor 404 is disconnected from feedback signal $U_{FB}$ 124.

Buffer sample and hold circuit 407 includes buffer 409, switch S3, and capacitor 410. One end of buffer 409 is coupled to receive the output of pre-sample and hold circuit 401 and the outer end is coupled to switch S3. Switch S3 is controlled by buffer sample and hold control signal 441 received from sample control circuit 419. In operation, when switch S3 is turned on (closed), capacitor 410 is charged by buffer 409 and the output of pre-sample and hold circuit 401. When switch S3 is turned off (opened), capacitor 410 is disconnected from the output of pre-sample and hold circuit 401.

Final sample and hold circuit 413 includes buffer 415, switch S4, and capacitor 416. One end of buffer 415 is coupled to receive the output of buffer sample and hold circuit 407 and the other end is coupled to switch S4. Switch S4 is controlled by final sample and hold control signal 447 received from sample control circuit 419. In operation, when switch S4 is turned on (closed), capacitor 416 is charged by the buffer 415 and the output of buffer sample and hold circuit 407. When switch S4 is turned off (opened), capacitor 416 is disconnected from the output of buffer sample and hold circuit 407.

In the illustrated example, sample control circuit 419 includes OR gate 426, inverter 442, AND gates 427, 437, and 443, and one shot circuits 421, 425, 429, 433, 435, 439, and 445 operable to output a pulse in response to a rising or falling edge on their respective inputs. In other words, the outputs of one shot circuits 421, 425, 429, 433, 435, 439, and 445 transition to a logic high value and quickly fall to a logic low value (or vice versa) in response to a rising or falling edge of a signal received at their respective inputs. In the embodiment shown in FIG. 4, one shot circuits (also referred to as monostable multivibrators) 421, 425, 429, 433, 439, and 445 can be operable to output a pulse in response to a rising edge on their respective input signals, while one shot circuit 435 can be operable to output a pulse in response to a falling edge on its input signal. However, it should be appreciated that if diode conduction signal $D_{COND}$ 310 is inverted, one shot circuits 421, 425, 429, 433, 439, and 445 can alternatively be operable to output a pulse in response to a falling edge on their respective input signals while one shot circuit 435 can be operable to output a pulse in response to a rising edge on its input signal. Additionally, it should be appreciated that the one shot circuits discussed may output logic high or logic low pulses. For the example shown in FIG. 4, the one shot circuits generate logic high pulses.

One shot circuit 421 is coupled to receive diode conduction signal $D_{COND}$ 310 and one shot circuits 429, 439, and 445 are coupled to output pre-sample and hold control signal 431, buffer sample and hold control signal 441, and final sample and hold control signal 447, respectively.

Figure 5:
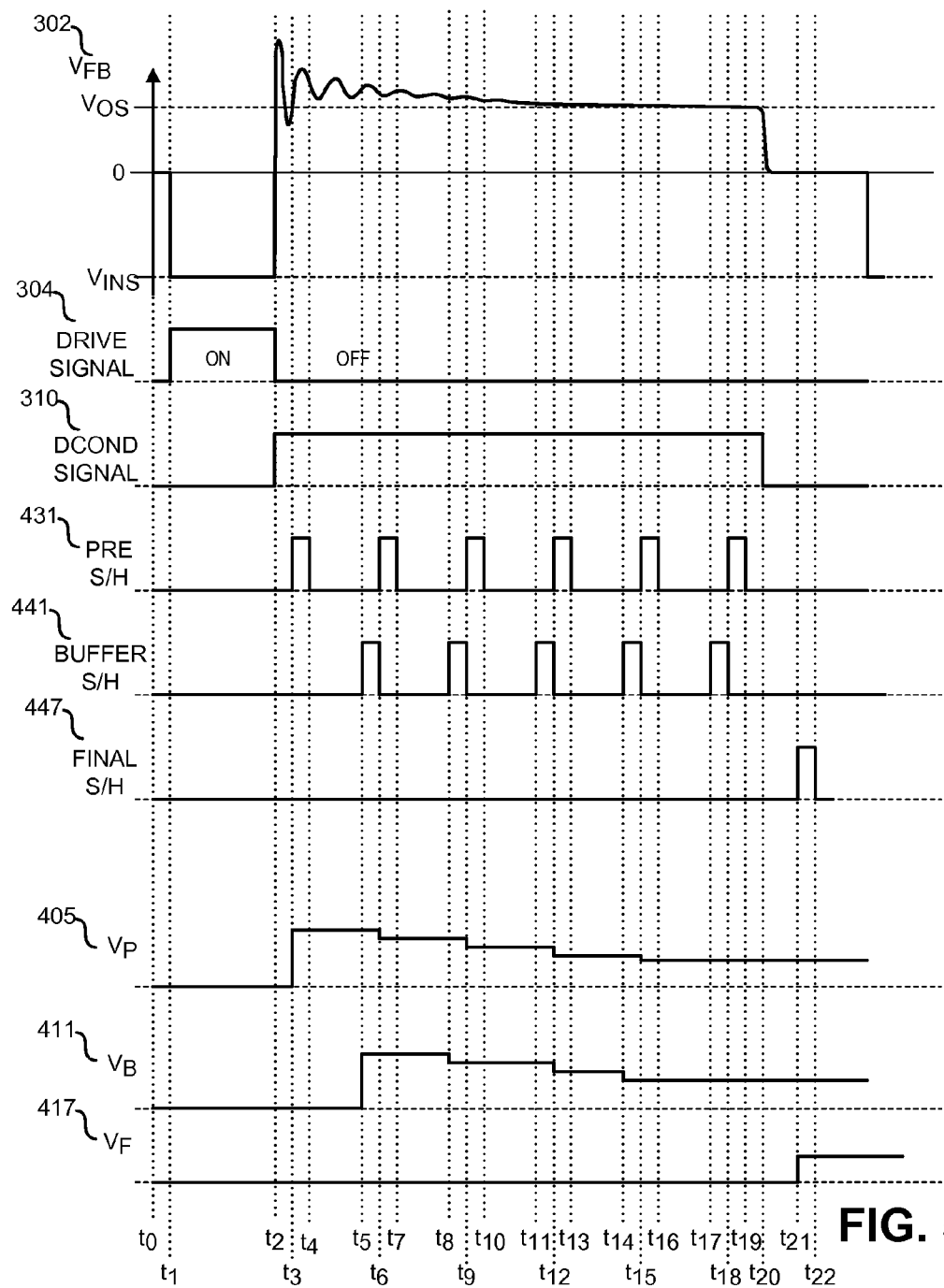
FIG. 5 illustrates example voltage waveforms associated with an example buffer sampling circuit in accordance with teachings of the present disclosure.

The operation of buffer sampling circuit 132 will now be described with respect to FIG. 5, which illustrates example voltage waveforms associated with the example buffer sampling circuit 132 of FIG. 4 during one switching cycle. For simplicity, all voltages shown in FIG. 5 are at a low level at $t_O$. It should be appreciated, however, that the voltages shown in FIG. 5 can start at different values depending on the system design. At time $t_1$, drive signal 304 is driven high. As such, the sense voltage $V_{SENSE}$ 302 goes negative to a magnitude $V_{INS}$ that is representative of the input voltage $V_{IN}$ 102. At time $t_2$ (after an amount of time determined by controller 122), drive signal 304 is driven low. As a result, the output rectifier D1 114 begins to conduct and the feedback voltage $V_{FB}$ 302 is representative of the output voltage $V_O$. As shown in FIG. 5, the feedback voltage $V_{FB}$ 302 converges to a positive voltage $V_{OS}$ that is representative of the output voltage $V_O$. Further shown in FIG. 5, there is ringing at the feedback voltage $V_{FB}$ 302. Also at time $t_2$, the output diode D1 114 begins conducting, causing diode conduction signal $D_{COND}$ 310 to transition to a logic high value. The difference between time $t_2$ and time $t_1$ may be referred to as the on-time of the switch.

Referring back to FIG. 4, the transition of diode conduction signal $D_{COND}$ 310 from a logic low value to a logic high value causes one shot circuit 421 to output a pulse. The pulse outputted by one shot circuit 421 is received at one input of OR-gate 426. At this time, the other input of OR-gate 426 receives a logic low value, causing OR-gate 426 to output a logic high value for the duration of the pulse outputted by one shot circuit 421. The pulse outputted by OR-gate 426 is then received at the input of one shot circuit 425, which is operable to output a pulse in response to a rising edge on its input, causing one shot circuit 425 to output a pulse similar to that outputted by OR-gate 426. The pulse outputted by one shot circuit 425 is then received at the input of AND-gate 427 along with diode conduction signal $D_{COND}$ 310 (which is currently at a logic high value), causing AND-gate 427 to output a pulse similar to that outputted by one shot circuit 425. The pulse outputted by AND-gate 427 is then received at the input of one shot circuit 429 causing one shot circuit 429 to output a pulse similar to that outputted by AND-gate 427. The output of one shot 429 is received by switch S2 as pre-sample and hold signal PRE S/H 431. As such, the pre-sample and hold signal 431 pulses to a logic high value, causing switch S2 to close for the duration of the pulse. While switch S2 is closed, capacitor 404 is charged by feedback signal $U_{FB}$ 124. As will be further discussed, the feedback signal $U_{FB}$ 124 is sampled by closing switch S2 and the sampled value is held by capacitor 404.

Referring now to FIG. 5, the pulse in pre-sample and hold control signal 431 is shown between time $t_3$ and $t_4$. Further shown in FIG. 5 is a delay that may occur between the diode conduction signal $D_{COND}$ 310 transitioning high at time $t_2$ and the pulse in pre-sample and hold control signal 431 at time $t_3$. This delay may be caused by various factors, such as propagation delay of logic circuits or the sharpness of the rising edge of the feedback voltage $V_{FB}$ 302. Since the pulse in pre-sample and hold control signal 431 causes capacitor 404 to be charged by feedback signal $U_{FB}$ 124 and buffer 403, the duration of the pulse ($t_4$ minus $t_3$) generated by one shot circuit 429 can be configured to be sufficiently long for the value of the feedback signal $U_{FB}$ 124 (indicative of the feedback voltage $V_{FB}$ 302 in FIG. 4) to be sampled by capacitor 404. As shown in FIG. 5 voltage $V_P$ 405 increases to a non-zero value at time $t_3$ when pre-sample and hold control signal 431 transitions to a logic high value. The voltage $V_P$ 405 is the sampled voltage value of the feedback signal $U_{FB}$ 124 when switch S2 is enabled. In one example, voltage $V_P$ 405 is the sampled voltage value of the feedback signal $U_{FB}$ 124 at time $t_4$.

At time $t_4$, pre-sample and hold control signal 431 transitions to a logic low value, causing switch S2 to open. Since switch S3 is also open (because buffer sample and hold control signal 441 is also at a logic low value) at time $t_4$, there is no path through which capacitor 404 can discharge, resulting in a substantially constant value for voltage $V_P$ 405 on capacitor 404.

Referring back to FIG. 4 and as discussed above, the pulse generated by OR-gate 426 is received by one shot circuit 425. This pulse is also received by one shot circuit 433, causing one shot circuit 433 to output a pulse. The pulse outputted by one shot circuit 433 is then received at the input of one shot circuit 435, which is operable to output a pulse in response to a falling edge on its input, causing one shot circuit 435 to output a pulse. By using a one shot circuit which triggers at the falling edge of its input as one shot circuit 435, one shot circuit 433 can be used as a delay circuit having a delay equal to the duration of its pulse. The pulse outputted by one shot circuit 435 is then received at the input of AND-gate 437 along with diode conduction signal $D_{COND}$ 310 (which is currently at a logic high value), causing the output of AND-gate 437 to transition from a logic low to a logic high value. The rising edge in the output of AND-gate 437 is then received at the input of one shot circuit 439, causing one shot circuit 439 to output a pulse. The output of one shot circuit 439 is received by switch S3 as buffer sample and hold control signal 441. As such, the buffer sample and hold control signal 441 pulses to a logic high value, causing switch S3 to close for the duration of the pulse. While switch S3 is closed, capacitor 410 is charged by capacitor 404 and buffer 409. In other words, the value stored on capacitor 404 is transferred to capacitor 410.

Referring now to FIG. 5, the pulse in buffer sample and hold control signal 441 is shown between time $t_5$ and $t_6$. Since the pulse in buffer sample and hold control signal 441 causes capacitor 410 to be charged by capacitor 404 and buffer 409, the duration of the pulse ($t_6$ minus $t_5$) output by one shot circuit 439 can be configured to be sufficiently long for the value held on capacitor 404 to be transferred to capacitor 410. As shown in FIG. 5 voltage $V_B$ 411 increases to a non-zero value at time $t_5$ when buffer sample and hold control signal 441 transitions to a logic high value. Further, the voltage $V_B$ 411 increase to substantially the same value as voltage $V_P$ 405 at time $t_5$.

At time $t_6$, buffer sample and hold control signal 441 transitions to a logic low value, causing switch S3 to open. Since switch S4 is also open (because final sample and hold control signal 447 is also at a logic low value) at time $t_6$, there is no path through which capacitor 410 can discharge, resulting in a substantially constant value for voltage $V_B$ 411 on capacitor 410.

In one example, one shot circuit 425 may be similar or identical to one shot circuit 435, AND-gate 427 may be similar to AND-gate 437, and one shot circuit 429 may be similar to one shot circuit 439. In this example, the delay between the pulse of pre-sample and hold control signal 431 and buffer sample and hold control signal 441 (time between time $t_3$ and $t_5$) can be approximately equal to the duration of the pulse of one shot circuit 433. In this way, one shot circuit 433 can be used to control the delay between the enablement of switches S2 and S3. This delay can be at least partially selected based on the characteristics of the output diode and how quickly the feedback voltage $V_{FB}$ 302 falls to have a sampling frequency to obtain a sample of feedback signal $U_{FB}$ 124 taken a sufficiently short duration before the end of the output diode conduction time. In one example, the delay between the enablement of switches S2 and S3 may be approximately 100 nanoseconds.

Referring back to FIG. 4 and as discussed above, the output of one shot circuit 439 (buffer sample and hold control signal 441) is received by switch S3. When the buffer sample and hold control signal 441 pulses to a logic high value, this pulse is also fed back into the input of OR-gate 426. In response to receiving the pulse from one shot circuit 439, the output of OR-gate 426 transitions to a logic high value for the duration of the received pulse. The propagation of this pulse from OR-gate 426 to one shot circuits 429 and 439 can be repeated in a similar manner as discussed above while diode conduction signal $D_{COND}$ 310 remains at a logic high value. Thus, OR-gate 426 is operable to output a pulse in response to either diode conduction signal $D_{COND}$ 310 initially transitioning to a logic high value or one shot circuit 439 outputting a pulse. In this way, sample control circuit 419 can cause pre-sample and hold circuit 401 and buffer sample and hold circuit 407 to alternatingly sample and hold their respective inputs while diode conduction signal $D_{COND}$ 310 remains at a logic high value.

To illustrate, FIG. 5 shows pre-sample and hold control signal 431 transitioning to a logic high value at time $t_6$ as buffer sample and hold control signal 441 transitions low. While FIG. 5 shows pre-sample and hold control signal 431 transitioning to a logic high value at substantially the same time as buffer sample and hold control signal 441 transitioning low, it should be appreciated that there may be a small delay between the transitions to prevent switches S2 and S3 from being closed at the same time. As shown in FIG. 5, pre-sample and hold control signal 431 and buffer sample and hold control signal 441 are alternatingly driven high while diode conduction signal $D_{COND}$ 310 remains at a logic high value. In this way, pre-sample and hold circuit 401 repeatedly samples and holds the value of feedback signal $U_{FB}$ 124 (indicative of the feedback voltage $V_{FB}$ 302) at an interval represented by time $t_6$ minus $t_3$ (or similarly time $t_9$ minus $t_6$, time $t_{12}$ minus $t_9$, time $t_{15}$ minus $t_{12}$, or time $t_{18}$ minus $t_{15}$). This duration is partially determined by the duration of the pulse outputted by one shot circuit 433. Similarly, buffer sample and hold circuit 407 repeatedly samples and holds the value of voltage $V_P$ 405 (indicative of the sampled feedback voltage $V_{FB}$ 302 stored on capacitor 404) at an interval represented by time $t_8$ minus $t_5$ (or similarly time $t_{11}$ minus $t_8$, time $t_{14}$ minus $t_{11}$, or time $t_{17}$ minus $t_{14}$). Based on the circuit configuration shown in FIG. 4, buffer sample and hold circuit 407 is configured to sample its input at substantially the same interval as pre-sample and hold circuit 401.

As shown in FIG. 5, voltages $V_P$ 405 and $V_B$ 411 stored on capacitors 404 and 410, respectively, have cascading values that decrease each time their respective control signal transitions to a logic high level. This is partially caused by the overall decrease in the voltage of feedback signal $U_{FB}$ 124 over time caused by feedback voltage $V_{FB}$ 302 converging to voltage $V_{OS}$ after initially overshooting that value when drive signal 304 is drive to a logic low value. It should be appreciated that the voltages $V_P$ 405 and $V_B$ 411 are shown to have cascading values that decrease with time to reflect the overall decrease in the voltage of feedback signal $U_{FB}$ 124, and that the actual values of voltages $V_P$ 405 and $V_B$ 411 may increase or decrease over time due to the ringing in feedback signal $U_{FB}$ 124.

As mentioned above, sample control circuit 419 can cause pre-sample and hold circuit 401 and buffer sample and hold circuit 407 to alternatingly sample and hold their respective inputs while diode conduction signal $D_{COND}$ 310 remains at a logic high value. However, when diode conduction signal $D_{COND}$ 310 transitions to a logic low value, sample control circuit can cause final sample and hold circuit 413 to sample the value at its input. Specifically, as shown in FIG. 4, as long as diode conduction signal $D_{COND}$ 310 remains at a logic high value, AND-gates 427 and 437 will repeatedly propagate the pulses of one shot circuits 425 and 435 through sample control circuit 419 as described above. However, when diode conduction signal $D_{COND}$ 310 transitions to a logic low value, AND-gates 427 and 437 are prevented from outputting a logic high value. Instead, AND-gate 443 outputs a logic high value in response to receiving the pulse from one shot circuit 435 and an inverted diode conduction signal $D_{COND}$ 310 from inverter 442. Since the one shot circuit 435 outputs a pulse (in other words, the output of one shot circuit 435 transitions to a logic high value and then quickly falls to a logic low value), the AND gate 443 also outputs a pulse. The rising edge of the pulse outputted by AND-gate 443 is then received at the input of one shot circuit 445, causing one shot circuit 445 to output a pulse. The output of one shot circuit 445 is received by switch S4 as final sample and hold control signal 447. As such, final sample and hold control signal 447 pulses to a logic high value, causing switch S4 to close for the duration of the pulse. While switch S4 is closed, capacitor 416 is charged by capacitor 410 and buffer 415. In other words, the value stored on capacitor 410 is transferred to capacitor 416.

Referring now to FIG. 5, diode conduction signal $D_{COND}$ 310 is shown transitioning to a logic low value at time $t_{20}$. In response to diode conduction signal $D_{COND}$ 310 transitioning low, a pulse is generated in final sample and hold control signal 447 between time $t_{21}$ and $t_{22}$. Since the pulse in final sample and hold control signal 447 causes capacitor 416 to be charged by capacitor 410 and buffer 415, the duration of the pulse ($t_{22}$ minus $t_{21}$) generated by one shot circuit 445 can be configured to be sufficiently long for the value held on capacitor 410 to be transferred to capacitor 416. As shown in FIG. 5 voltage $V_F$ 417 increases to a non-zero value at time $t_{21}$ when final sample and hold control signal 447 transitions to a logic high value. Further, the voltage $V_F$ 417 increase to substantially the same value as voltage $V_B$ 411 at time $t_{21}$. Voltage $V_F$ 417 can be output but buffer sampling circuit 132 to drive logic 134 as the sampled signal $U_{SMP}$. By sampling feedback signal $U_{FB}$ 124 in this manner, buffer sampling circuit 132 can provide a sample of the output of the power converter near the end of the diode conduction time. Additionally, by providing the second to last sample taken (sample stored by buffer sample and hold circuit 407 between time $t_{17}$ and $t_{18}$), buffer sampling circuit 132 avoids providing a sample taken during the drop off in the feedback voltage $V_{FB}$ 302 that can occur at the end of the diode conduction time.

Figure 6:
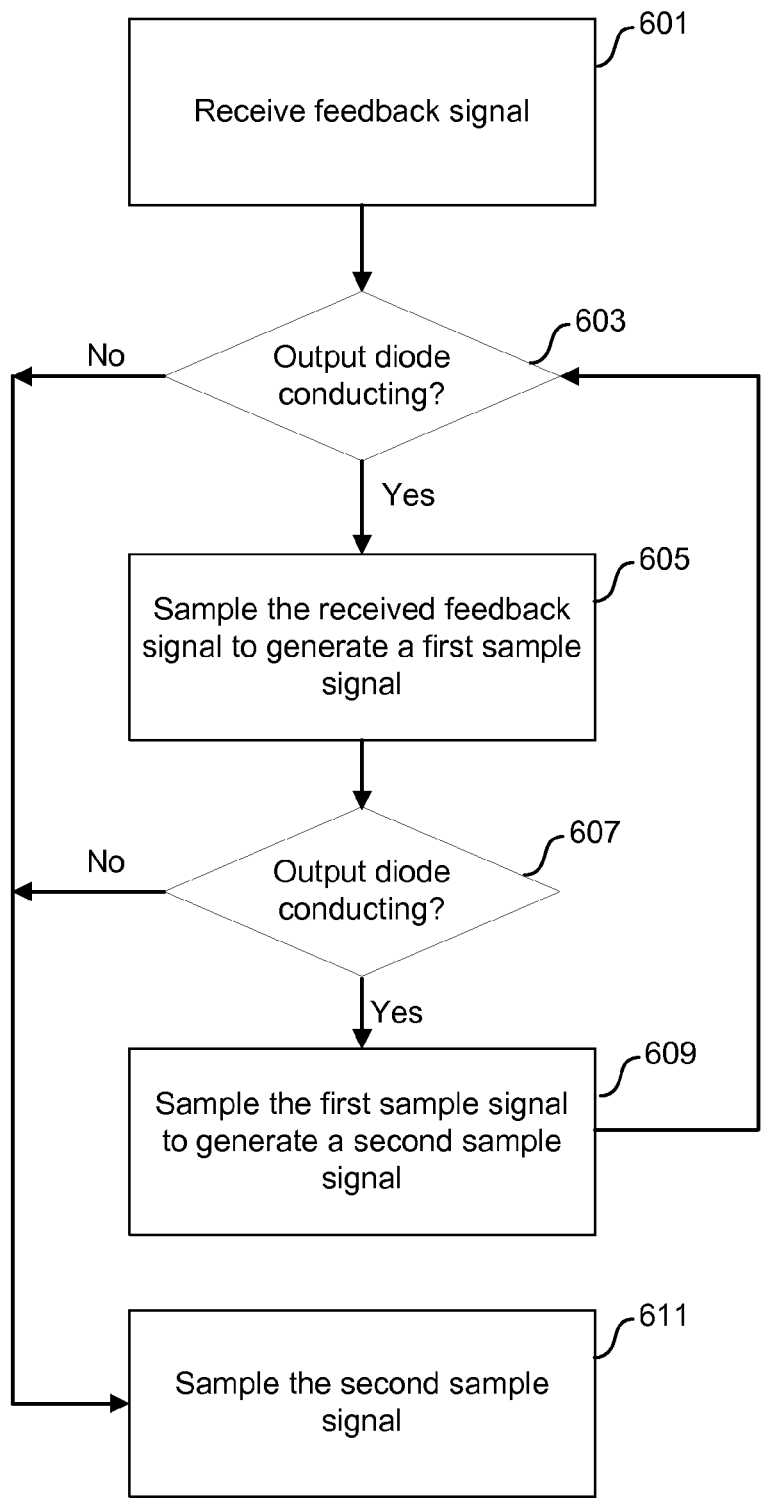
FIG. 6 illustrates example process for sampling a feedback signal in accordance with teachings of the present disclosure.

FIG. 6 illustrates an example process 600 for sampling a feedback signal that is representative of an output of a power converter. In one example, process 600 can be performed using a sampling circuit similar or identical to buffer sampling circuit 132. At block 601, a feedback signal representative of an output of a power converter can be received. In one example, the feedback signal can be similar or identical to feedback signal $U_{FB}$ 124 received from a sense circuit similar or identical to sense circuit 120, described above.

At block 603, it can be determined whether or not the output diode of the power converter is conducting. In one example, the conduction state of the diode can be represented by a signal similar or identical to diode conduction signal $D_{COND}$ 310. In this example, the diode conduction state can be used by a control circuit (e.g., sample control circuit 419) to selectively cause one or more sample circuits to sample their respective input, as described above with respect to FIGS. 4 and 5. If the output diode is conducting, the process proceeds to block 605. If, however, the output diode is not conducting, the process proceeds to block 611.

At block 605, the feedback signal received at block 601 can be sampled to generate a first sample signal. In one example, the feedback signal can be similar or identical to feedback signal $U_{FB}$ 124 and can be sampled using a circuit similar or identical to pre-sample and hold circuit 401. In this example, a switch (e.g., switch S2) can be controlled by a control circuit (e.g., sample control circuit 419) to selectively charge a capacitor (e.g., capacitor 404) using the received feedback signal (e.g., feedback signal $U_{FB}$ 124). Once the capacitor is charged, the process can proceed to block 607.

At block 607, it can be determined whether or not the output diode of the power converter is conducting. Block 607 can be similar or identical to block 603. If the output diode is conducting, the process proceeds to block 609. If, however, the output diode is not conducting, the process proceeds to block 611.

At block 609, the first sample signal can be sampled to generate a second sample signal. In one example, the first sample signal can include a voltage similar or identical to $V_P$ 405 stored on capacitor 404 and can be sampled using a circuit similar or identical to buffer sample and hold circuit 407. In this example, a switch (e.g., switch S3) can be controlled by a control circuit (e.g., sample control circuit 419) to selectively charge a capacitor (e.g., capacitor 410) using the first sample signal (e.g., voltage $V_P$ 405 generated by capacitor 404). Once the capacitor is charged, the process can return to block 603. The operations performed at blocks 603, 605, 607, and 609 can be repeated until the output diode ceases to conduct.

If, at block 603 or 607, it is determined that the output diode is not conducting, then the process can proceed to block 611.

At block 611, the second sample signal generated at block 609 can be sampled. In one example, the second sample signal can include a voltage similar or identical to $V_B$ 411 stored on capacitor 410 and can be sampled using a circuit similar or identical to final sample and hold circuit 413. In this example, a switch (e.g., switch S4) can be controlled by a control circuit (e.g., sample control circuit 419) to selectively charge a capacitor (e.g., capacitor 416) using the second sample signal (e.g., voltage $V_B$ 411 generated by capacitor 410). The voltage (e.g., $V_F$ 417) stored on the capacitor (e.g., capacitor 416) can be provided to a controller or a component of a controller as the sampled valued of the feedback signal that is representative of an output of the power converter. For example, the voltage (e.g., $V_F$ 417) can be provided as a sampled signal (e.g., sampled signal $U_{SMP}$) to drive logic (e.g., drive logic 134) of a controller (e.g., controller 122) of the power converter (e.g., power converter 100).

By sampling the feedback signal in this way, the buffered sample (second sample) obtained prior to the output diode ceasing to conduct is provided to the controller as the sampled signal. This allows the controller to obtain a sample of the feedback signal that was obtained close to the end of the output diode conduction time. As a result, a more accurate measurement of the output of the power converter can be obtained.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A circuit for sampling a feedback signal representative of an output of a power converter, the circuit comprising:
   a first sample circuit having an input coupled to receive the feedback signal representative of the output of the power converter, the first sample circuit comprising a first switch coupled to a first capacitor, wherein the first sample circuit is operable to sample the feedback signal and generate a first sample signal based on the sampling of the feedback signal;
   a second sample circuit having an input coupled to receive the first sample signal from the first sample circuit, the second sample circuit comprising a second switch coupled to a second capacitor, wherein the second sample circuit is operable to sample the first sample signal and generate a second sample signal based on the sampling of the first sample signal;
   a third sample circuit having an input coupled to receive the second sample signal from the second sample circuit, the third sample circuit comprising a third switch coupled to a third capacitor, wherein the third sample circuit is operable to sample the second sample signal and generate a third sample signal based on the sampling of the second sample signal; and
   a sample control circuit coupled to the first, second, and third sample circuits, wherein the sample control circuit is operable to:
   cause the first and second sample circuits to alternatingly sample the signals received at their respective inputs when an output diode of the power converter is conducting; and
   cause the third sample circuit to sample the second sample signal in response to the output diode of the power converter ceasing to conduct.

2. The circuit of claim 1, wherein the sample control circuit is coupled to control the first, second, and third switches, and wherein the sample control circuit is operable to cause the first, second, and third sample circuits to sample the signals received at their respective inputs by controlling the first, second, and third switches.

3. The circuit of claim 2, wherein the sample control circuit comprises a plurality of one shot circuits coupled to control the first, second, and third switches.

4. The circuit of claim 1, wherein the first, second, and third sample circuits are operable to sample the signals at their respective inputs when their respective switches conduct current from their respective inputs to their respective capacitors.

5. The circuit of claim 1, wherein the sample control circuit is operable to cause only one of the first, second, and third sample circuits to sample the signals at their respective inputs at a time.

6. The circuit of claim 1, wherein the sample control circuit is coupled to receive a diode conduction signal representative of a conduction state of the output diode of the power converter.

7. The circuit of claim 6, wherein causing the third sample circuit to sample the second sample signal in response to the output diode of the power converter ceasing to conduct comprises causing the third sample circuit to sample the second sample signal in response to a change in level of the diode conduction signal.

8. The circuit of claim 6, wherein the sample control circuit comprises a plurality of one shot circuits operable to cause the first, second, and third sample circuits to sample the signals received at their respective inputs based on the diode conduction signal.

9. The circuit of claim 1, wherein the circuit is incorporated within a controller for the power converter.

10. A method for sampling a feedback signal representative of an output of a power converter, the method comprising:
receiving the feedback signal representative of the output of the power converter;
while an output diode of the power converter is conducting, alternatingly:
sampling, using a first switch coupled to a first capacitor, the feedback signal representative of the output of the power converter to generate a first sample signal based on the sampling of the feedback signal; and
sampling, using a second switch coupled to a second capacitor, the first sample signal to generate a second sample signal based on the sampling of the first sample signal; and
sampling, using a third switch coupled to a third capacitor, the second sample signal in response to the output diode of the power converter ceasing to conduct.

11. The method of claim 10, further comprising controlling the first, second, and third switches using a plurality of one shot circuits.

12. The method of claim 10, wherein only one of the feedback signal, the first sample signal, and the second sample signal is sampled at a time.

13. The method of claim 10, further comprising receiving a diode conduction signal representative of a conduction state of the output diode of the power converter.

14. The method of claim 13, wherein sampling the second sample signal is performed in response to a change in level of the diode conduction signal.

15. The method of claim 13, wherein alternatingly sampling the feedback signal and the first sample signal is performed in response to a first change in level of the diode conduction signal, and wherein alternatingly sampling the feedback signal and the first sample signal is performed until a second change in level of the diode conduction signal.

16. A circuit for sampling a feedback signal representative of an output of a power converter, the circuit comprising:
a first sample circuit having an input coupled to receive the feedback signal representative of the output of the power converter, the first sample circuit comprising a first switch coupled to a first capacitor, wherein the first sample circuit is operable to sample the feedback signal and generate a first sample signal when an output diode of the power converter is conducting;
a second sample circuit having an input coupled to receive the first sample signal from the first sample circuit, the second sample circuit comprising a second switch coupled to a second capacitor, wherein the second sample circuit is operable to sample the first sample signal and generate a second sample signal, wherein the first and second sample circuits alternatingly sample the signals received at their respective inputs when the output diode of the power converter is conducting; and
a third sample circuit having an input coupled to receive the second sample signal from the second sample circuit, the third sample circuit comprising a third switch coupled to a third capacitor, wherein the third sample circuit is operable to sample the second sample signal and generate a third sample signal when the output diode of the power converter ceases to conduct.

17. The circuit of claim 16 further comprising a sample control circuit coupled to control the first, second, and third switches, and wherein the sample control circuit is operable to cause the first, second, and third sample circuits to sample the signals received at their respective inputs by controlling the first, second, and third switches.

18. A power converter comprising:
an energy transfer element;
a switch coupled to the energy transfer element such that a current is conducted through the energy transfer element and the power switch during an on time of the switch; and
a controller coupled to provide a drive signal to control the switch to regulate an output of the power converter, the drive signal controlled based at least in part by a sample of a feedback signal representative of an output of the power converter, wherein the controller comprises:
a first sample circuit having an input coupled to receive the feedback signal representative of the output of the power converter, the first sample circuit comprising a first switch coupled to a first capacitor, wherein the first sample circuit is operable to sample the feedback signal and generate a first sample signal when an output diode of the power converter is conducting;
a second sample circuit having an input coupled to receive the first sample signal from the first sample circuit, the second sample circuit comprising a second switch coupled to a second capacitor, wherein the second sample circuit is operable to sample the first sample signal and generate a second sample signal, wherein the first and second sample circuits alternatingly sample the signals received at their respective inputs when the output diode of the power converter is conducting; and
a third sample circuit having an input coupled to receive the second sample signal from the second sample circuit, the third sample circuit comprising a third switch coupled to a third capacitor, wherein the third sample circuit is operable to sample the second sample signal and generate a third sample signal when the output diode of the power converter ceases to conduct.

19. The circuit of claim 18 further comprising a sample control circuit coupled to control the first, second, and third switches, and wherein the sample control circuit is operable to cause the first, second, and third sample circuits to sample the signals received at their respective inputs by controlling the first, second, and third switches.

20. The circuit of claim 19, wherein the sample control circuit is coupled to receive a diode conduction signal representative of a conduction state of the output diode of the power converter.

21. The circuit of claim 20, wherein the sample control circuit comprises a plurality of one shot circuits operable to cause the first, second, and third sample circuits to sample the signals received at their respective inputs based on the diode conduction signal.

* * * * *